United States Patent [19]

Yamamoto

[11] Patent Number: 5,998,231
[45] Date of Patent: *Dec. 7, 1999

[54] SEMICONDUCTOR LIGHT-EMITTING DEVICE AND METHOD OF MANUFACTURING THE SAME

[75] Inventor: Tadashi Yamamoto, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/964,707

[22] Filed: Nov. 5, 1997

Related U.S. Application Data

[62] Division of application No. 08/730,794, Oct. 16, 1996, abandoned.

[30] Foreign Application Priority Data

Oct. 20, 1995 [JP] Japan .................................. P07-272975
Dec. 19, 1995 [JP] Japan .................................. P07-330774

[51] Int. Cl.$^6$ .................................................. H01L 21/20
[52] U.S. Cl. ............................................... 438/41; 438/46
[58] Field of Search .................................. 438/38, 39, 31, 438/40, 41, 46, 47, 22, 42, 43, 44, FOR 289, 483, 697, 701, 718; 148/DIG. 95, DIG. 65, DIG. 66; 372/45, 46

[56] References Cited

U.S. PATENT DOCUMENTS

| | | | |
|---|---|---|---|
| 5,065,402 | 11/1991 | Kawano | 372/46 |
| 5,345,460 | 9/1994 | Takiguchi et al. | 372/43 |
| 5,436,196 | 7/1995 | Miyashita | 438/41 |
| 5,604,764 | 2/1997 | Motoda et al. | 372/46 |
| 5,608,751 | 3/1997 | Shimoyoma et al. | 372/46 |
| 5,619,518 | 4/1997 | Horie et al. | 372/45 |
| 5,619,520 | 4/1997 | Sasai et al. | 372/46 |
| 5,661,076 | 8/1997 | Yoo et al. | 438/39 |

FOREIGN PATENT DOCUMENTS

| | | |
|---|---|---|
| 0 408 373 A2 | 1/1991 | European Pat. Off. . |
| 0 440 471 A2 | 8/1991 | European Pat. Off. . |
| 0 616 399 A1 | 9/1994 | European Pat. Off. . |

OTHER PUBLICATIONS

Bour et al., "Lateral Mode Discrimination in AlGaAsp Selectively Buried Ridge Waveguide Lasers". IEE Proceedings–J, vol. 139, No. 1, Feb. 1992.

Patent Abstract of Japan, Publication No. 04111378, Published Apr. 13, 1992, entitled "Semiconductor Laser," Application No. 02229152, Application Date: Aug. 30, 1990.

IEEE Journal of Selected Topics In Quantum Electronics, vol. 1, No. 2, Jun. 1995, "Real Index–Guided AlGaInP Visible Laser with High–Bandgap Energy AlInP Current Blocking Layer Grown by HCl–Assisted Metalorganic Vapor Phase Epitaxy," pp. 723–727.

*Primary Examiner*—Savitri Mulpuri
*Attorney, Agent, or Firm*—Hill & Simpson

[57] ABSTRACT

An AlGaInP-based semiconductor light-emitting device is of a real-guide type and has excellent crystallinity and excellent laser characteristics. In an AlGaInP-based semiconductor light-emitting device having at least a first conductivity-type first cladding layer (3), an active layer (4) and a second conductivity-type second cladding layer (5), a stripe-shaped ridge (8) is formed on the second cladding layer (5) and first conductivity-type AlGaAs current confinement layers (19) with a band gap larger than that of the active layer (4) and whose refractive index is smaller than that of the active layer are formed so as to bury grooves (7) formed at both sides of the stripe-shaped ridge (8).

4 Claims, 9 Drawing Sheets

F I G. 5
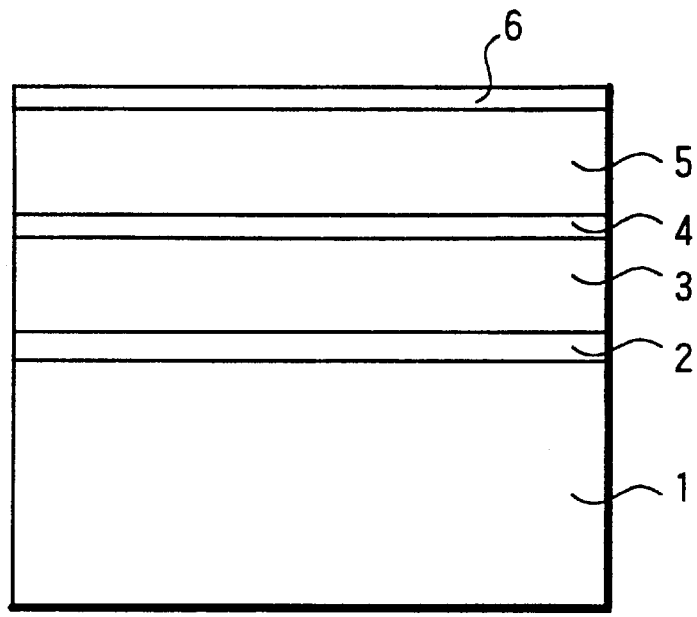
F I G. 6
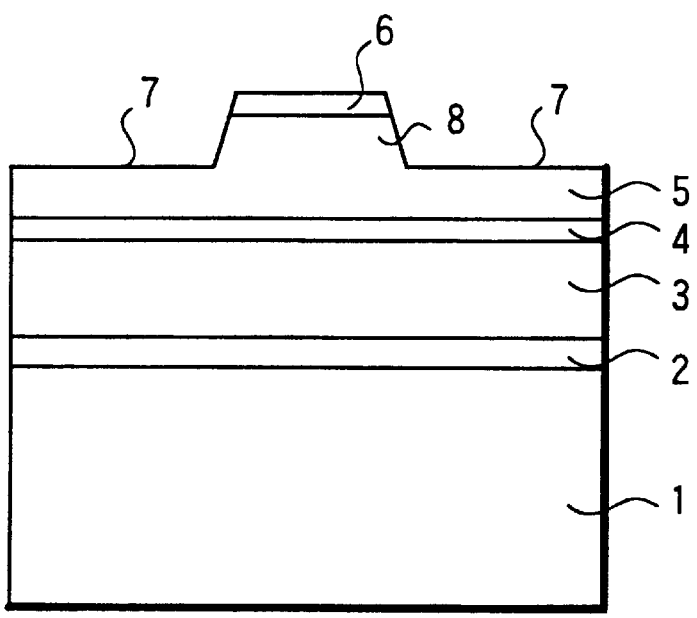

SEMICONDUCTOR LIGHT-EMITTING DEVICE AND METHOD OF MANUFACTURING THE SAME

This is a divisional of application Ser. No. 08/730,794, filed Oct. 16, 1996 now abandoned.

BACKGROUND OF THE INVENTION

The present invention relates to a semiconductor light-emitting device, and particularly to an AlGaInP-based red visible light semiconductor light-emitting device and a method of manufacturing the same.

Most of semiconductor light-emitting devices, e.g., semiconductor lasers are formed as index-guide structure in order to enhance performance.

AlGaInP-based red visible light semiconductor lasers of index-guide type are generally of loss-guide type in which a current confinement layer for confining a current path is made of GaAs whose band gap is smaller than that of a GaInP active layer and whose refractive index is larger than that of the GaInP active layer.

This AlGaInP-based semiconductor laser will be described below together with its manufacturing method.

As shown in FIG. 1, there is carried out a first epitaxial deposition process in which an n-type GaAs buffer layer 2, an n-type AlGaInP first cladding layer 3, a non-doped GaInP active layer 4, an AlGaInP second conductivity-type, i.e., p-type second cladding layer 5 and a p-type GaInP intermediate layer 6 are epitaxially deposited on a first conductivity-type, e.g., n-type GaAs substrate 1, in that order, thereby forming a laminated semiconductor layer.

Thereafter, as shown in FIG. 2, grooves 7 are formed at both sides of a stripe-shaped ridge 8 by etching to the extent that the grooves 7 reach the second cladding layer 5 but do not reach the active layer 4, for example, through the intermediate layer 6.

As shown in FIG. 3, there is carried out a second epitaxial deposition in which a first conductivity-type, e.g., n-type GaAs current confinement layer 9 is epitaxially deposited on the second cladding layer 5 so as to bury the grooves 7. The second epitaxial deposition is carried by selective epitaxial deposition. Specifically, in this case, a mask layer 10 for selective epitaxial deposition made of an insulating film such as an SiN film is epitaxially deposited on the ridge 8 and then GaAs is selectively and epitaxially deposited.

Thereafter, as shown in FIG. 4, the mask layer 10 is removed and there is carried out a third epitaxial deposition in which a second conductivity-type, i.e., p-type GaAs capping layer 11 is epitaxially deposited on the whole surface.

Then, although not shown, a first electrode is formed on the capping layer 11 so as to form an ohmic contact and a second electrode is formed on the back of the substrate 1 so as to form an ohmic contact.

This semiconductor laser is of so-called loss-guide structure because the current confinement layer 9 can absorb light emitted from the active layer 4 although a current is confined by the ridge 8 serving as a current path sandwiched by the current confinement layers 9.

However, because the loss-guide type semiconductor laser cannot avoid a problem of large power consumption, a semiconductor laser should preferably be formed as a real-guide type one in order to reduce a power consumption. In order to realize the real-guide type semiconductor laser, it is proposed that the current confinement layer 9 is made of AlGaInP whose band gap is smaller than that of the active layer 4 and whose refractive index is larger than that of the active layer 4. However, this AlGaInP-based semiconductor cannot be epitaxially deposited on uneven surface satisfactorily on which the ridge 8 is formed as shown in FIG. 2, e.g., AlGaInP-based semiconductor cannot be epitaxially deposited on a {111} crystal plane, for example, satisfactorily. As a result, dislocation occurs considerably, resulting in a semiconductor layer with many distortions. Therefore, a semiconductor laser with satisfactory laser characteristics cannot be made.

SUMMARY OF THE INVENTION

In view of the aforesaid aspect, it is an object of the present invention to provide a semiconductor light-emitting device of a real-guide type having excellent crystallinity and laser characteristics and a method of manufacturing such semiconductor light-emitting device.

According to the present invention, there is provided an AlGaInP-based semiconductor light-emitting device, e.g., semiconductor laser of real-guide type in which a power consumption can be decreased, a current-to-light conversion efficiency can be improved and which can produce high output. In addition, there can be obtained the semiconductor laser which is excellent in crystallinity and semiconductor laser characteristics (i.e., threshold current $I_{th}$ is small).

According to the present invention, there is provided an AlGaInP-based semiconductor light-emitting device which is comprised of a semiconductor substrate, at least a first conductivity-type first cladding layer, an active layer and a second conductivity-type second cladding layer, the first cladding layer, the active layer and the second cladding layer being formed on the semiconductor substrate, in which a stripe-shaped ridge is formed on the second cladding layer and first conductivity-type AlGaAs current confinement layers with a band gap larger than that of the active layer and whose refractive index is smaller than that of the active layer are formed across the stripe-shaped ridge so as to bury grooves formed on both sides of the stripe-shaped ridge.

According to the present invention, there is provided a method of manufacturing an AlGaAs-based semiconductor light-emitting device which is comprised of the steps of a first epitaxial deposition process in which at least a first conductivity-type first cladding layer, an active layer and a second conductivity-type second cladding layer are epitaxially deposited on a semiconductor substrate, an etching process for forming a stripe-shaped ridge on the laminated semiconductor layers to a depth such that the stripe-shaped ridge reaches said second cladding layer by etching, a second epitaxial deposition process in which a first conductivity-type AlGaAs current confinement layer with a band gap larger than that of the active layer and whose refractive index is smaller than that of the active layer is epitaxially deposited so as to bury grooves formed at both sides of the stripe-shaped ridge, a surface planarization process, and a process in which the AlGaAs current confinement layer formed on the stripe-shaped ridge is removed by etch-back.

According to the present invention, in the AlGaInP-based semiconductor light-emitting device, since the current confinement layers are made of AlGaAs, it is possible to form the current confinement layers with the band gap larger than that of the active layer and whose refractive index is smaller than that of the active layer by properly selecting the amount of Al. Therefore, there can be obtained the target real-guide type AlGaInP-based semiconductor light-emitting device, e.g., red semiconductor laser.

When the current confinement layers are made of AlGaAs, the selective epitaxial deposition process cannot be applied unlike the conventional semiconductor light-emitting device in which the current confinement layers are made of GaAs. Therefore, according to the present invention, the AlGaAs current confinement layer on the ridge is removed by the planarization process and the etch back. In this manner, there can be obtained the semiconductor light-emitting device, e.g., semiconductor laser according to the present invention.

BRIEF DESCRIPTION OF THE DRAWINGS

FIG. 5 is a schematic cross-sectional view illustrative of a step in a method of manufacturing a semiconductor light-emitting device according to an embodiment of the present invention;

FIG. 6 is a schematic cross-sectional view illustrative of a step in a method of manufacturing a semiconductor light-emitting device according to the embodiment of the present invention;

DETAILED DESCRIPTION OF THE PREFERRED EMBODIMENTS

Figure 1:
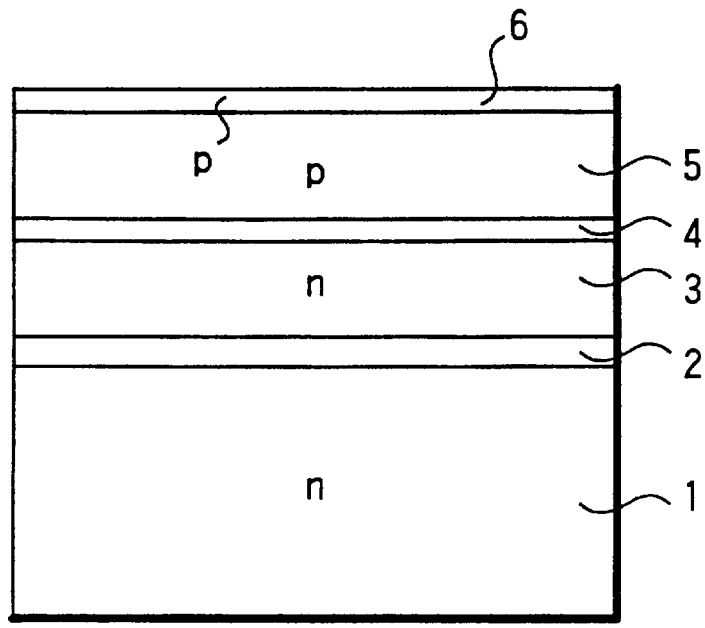
FIG. 1 is a schematic cross-sectional view illustrative of a step in a method of manufacturing a semiconductor light-emitting device.
Figure 2:
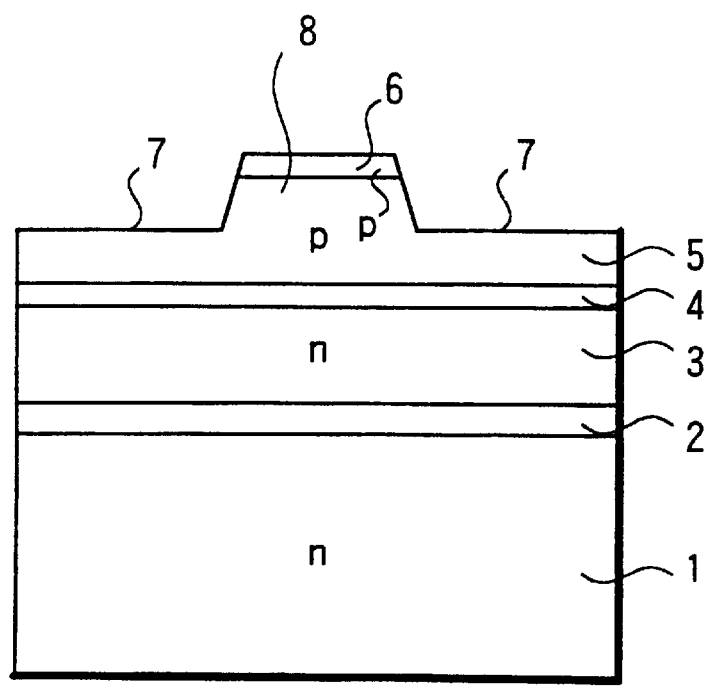
FIG. 2 is a schematic cross-sectional view illustrative of a step in a method of manufacturing a semiconductor light-emitting device.
Figure 3:
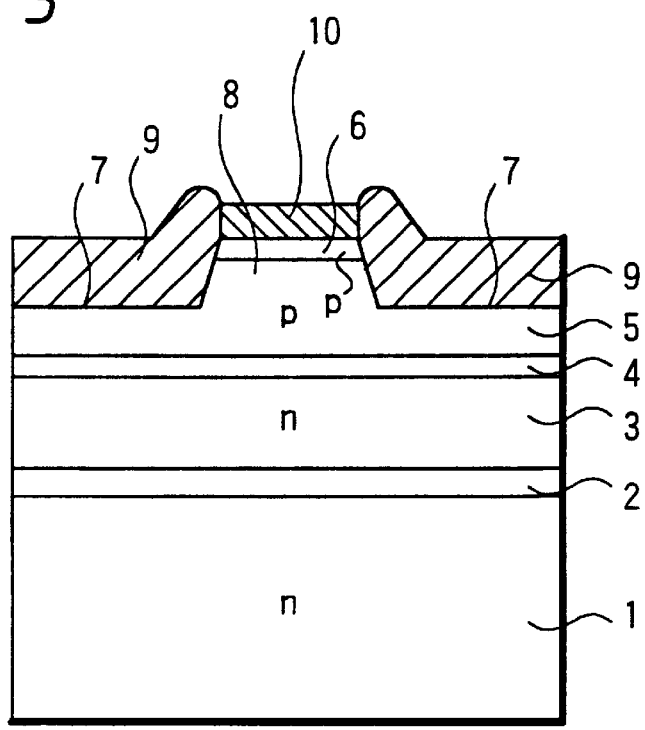
FIG. 3 is a schematic cross-sectional view illustrative of a step in a method of manufacturing a semiconductor light-emitting device.
Figure 4:
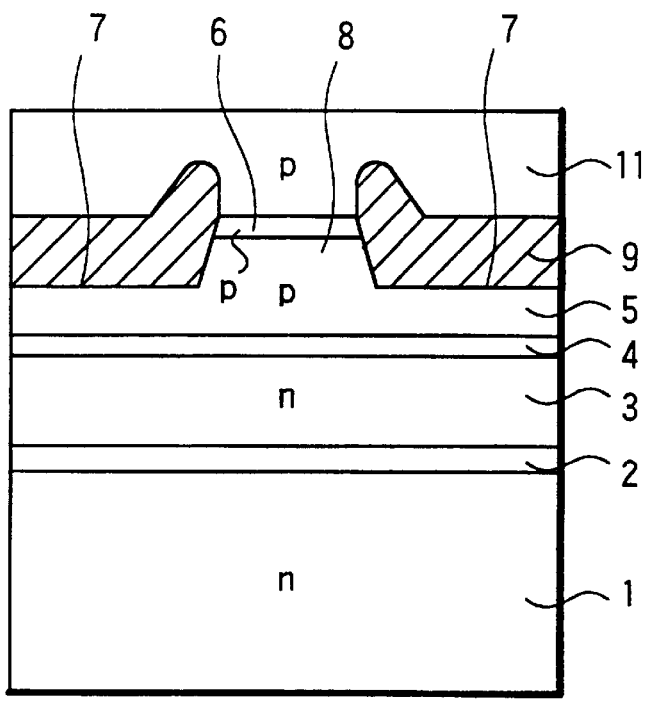
FIG. 4 is a schematic cross-sectional view illustrative of a step in a method of manufacturing a semiconductor light-emitting device.

A first embodiment of the present invention will hereinafter be described with reference to FIGS. 5 through 9. FIGS. 5 through 9 are schematic cross-sectional views showing respective steps in the method of manufacturing a semiconductor light-emitting device according to the present invention. In this embodiment, the present invention is applied to a so-called DH (double-heterojunction) type semiconductor laser in which cladding layers are formed at both sides of an active layer.

As shown in FIG. 5, a firs t epitaxial deposition process is carried out in which an n-type Gas buffer layer 2, an n-type AlGaInP first cladding layer 3, a non-doped or lightly-doped GaInP active layer 4, an AlGaInP second conductivity-type, e.g., p-type second cladding layer 5 and a p-type GaInP intermediate layer 6 are epitaxially deposited on a first conductivity-type,, e.g., n-type GaAs substrate 1, in that order, to thereby form a laminated semiconductor layer.

Thereafter, as shown in FIG. 6, at least a pair of stripe-shaped grooves 7 are formed across the intermediate layer 6 to a depth such that they reach the second cladding layer 5 but should not preferably reach the active layer 4. A stripe-shaped ridge 8 is formed between the grooves 7.

Figure 7:
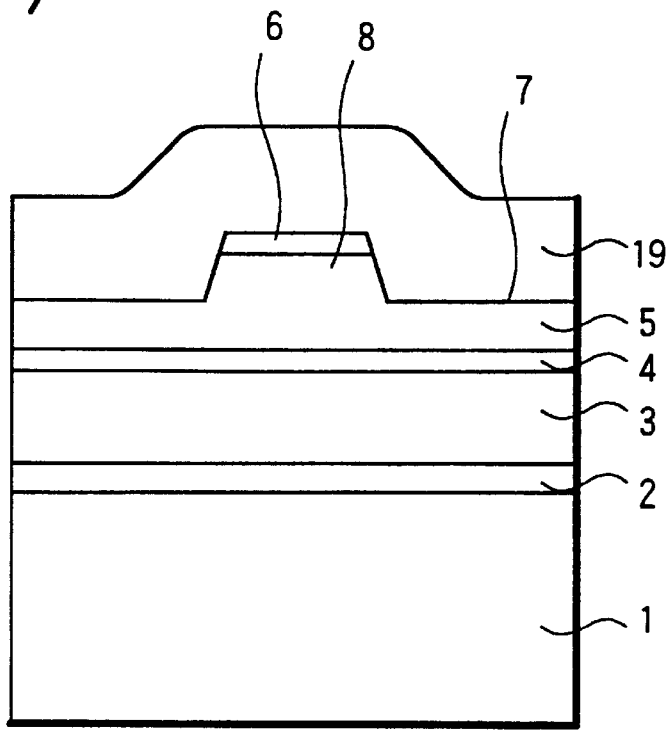
FIG. 7 is a schematic cross-sectional view illustrative of a step in a method of manufacturing a semiconductor light-emitting device according to the embodiment of the present invention.

Then, as shown in FIG. 7, there is carried out a second epitaxial deposition process in which an AlGaAs first conductivity-type, e.g., n-type current confinement layer 19 is formed on the laminated semiconductor layer so as to bury the grooves 7, in particular, according to the present invention, the n-type current confinement layer 19 is epitaxially deposited on the whole surface so as to cover the ridge 8.

Figure 8:
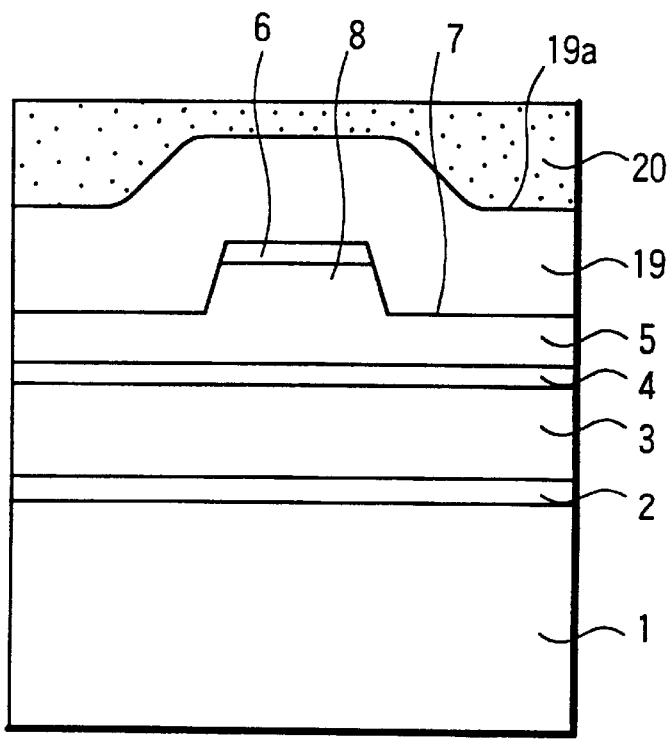
FIG. 8 is a schematic cross-sectional view illustrative of a step in a method of manufacturing a semiconductor light-emitting device according to the embodiment of the present invention.

Then, as shown in FIG. 8, there is carried out a planarization process in which the surface is made flat by coating a planarization layer 20 so as to bury a concave portion 19a produced due to the existence of the grooves 7 on the deposited surface of the current confinement layer 19. This planarization process can be carried out by forming a photoresist on the current confinement layer 19 as the planarization layer 20 by spin coat.

Figure 9:
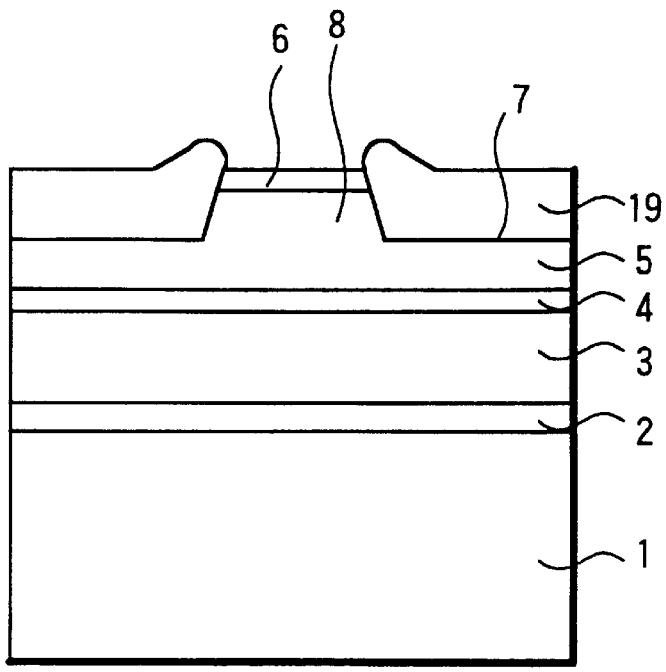
FIG. 9 is a schematic cross-sectional view illustrative of a step in a method of manufacturing a semiconductor light-emitting device according to the embodiment of the present invention.

Thereafter, the current confinement layer 19 on the ridge 8 is removed from the surface of the planarization layer 20 by etch back as shown in FIG. 9. Specifically, a current confinement layer 19 is limitedly formed within the grooves 7.

Figure 10:
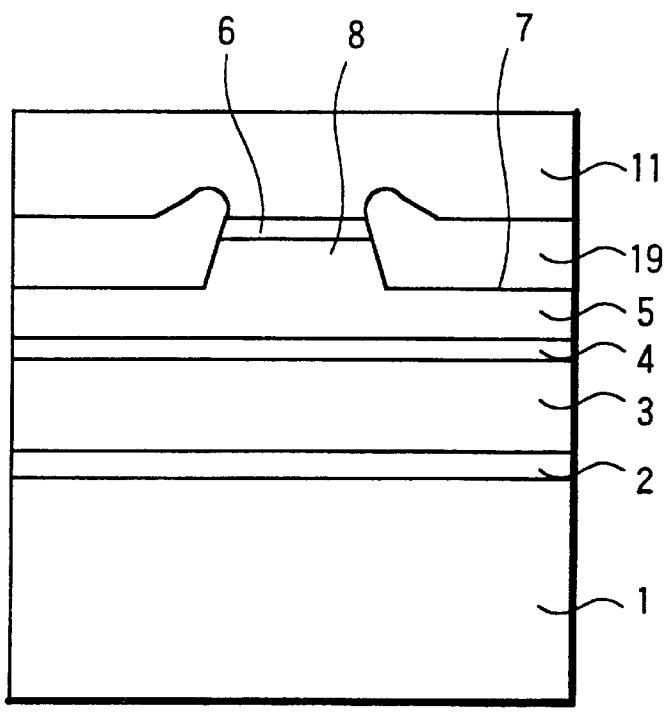
FIG. 10 is a schematic cross-sectional view illustrative of a step in a method of manufacturing a semiconductor light-emitting device according to the embodiment of the present invention.

Then, as shown in FIG. 10, there is carried out a third epitaxial deposition process in which a second conductivity-type, e.g., p-type GaAs capping layer 11 is epitaxially deposited on the whole surface.

Although not shown, a first electrode is deposited on the capping layer 11 so as to form an ohmic-contact and a second electrode is deposited on the back of the substrate so as to form an ohmic-contact.

As described above, in the AlGaInP-based semiconductor laser having at least the first conductivity-type first cladding layer 3, the active layer 4 and the second conductivity-type cladding layer 5, there is obtained the semiconductor laser according to the present invention in which the stripe-shaped ridge 8 is formed on the second cladding layer 5 and the first conductivity-type AlGaAs current confinement layers 19 with the band gap larger than that of the active layer 4 and whose refractive index is smaller than that of the active layer 4 are formed across the stripe-shaped ridge 8 so as to bury the grooves 7 formed on both sides of the stripe-shaped ridge 8.

According to the thus arranged semiconductor laser, the current is confined by using the ridge 8 sandwiched by the current confinement layers 19 as the current path as described above. The current confinement layer 19 is made of AlGaAs and if the amount of Al in the current confinement layer 19 is selected, then the band gap of the current confinement layer 19 is selected to be larger than that of the active layer 4 and the refractive index thereof is selected to be smaller than that of the active layer 4, thereby avoiding the effect for absorbing light emitted from the active layer 4. Therefore, the semiconductor laser according to the present invention is formed as the so-called real-guide type.

Further, as described above, according to the present invention, since the current confinement layer 19 is made of AlGaAs, layers can be epitaxially deposited satisfactorily on the laminated semiconductor layer on which the ridge 8 is formed. Therefore, there can be obtained the AlGaInP-based semiconductor laser having a low threshold current $I_{th}$, i.e., excellent laser characteristics.

While the semiconductor laser is constructed through the first to third epitaxial deposition processes as described above, the AlGaInP-based semiconductor laser according to the present invention may be constructed through the first and second epitaxial deposition processes.

A second embodiment in which the AlGaInP-based semiconductor laser is constructed through the first and second epitaxial deposition processes according to the present invention will hereinafter be described with reference to schematic cross-sectional views of FIGS. 11 through 15.

Figure 11:
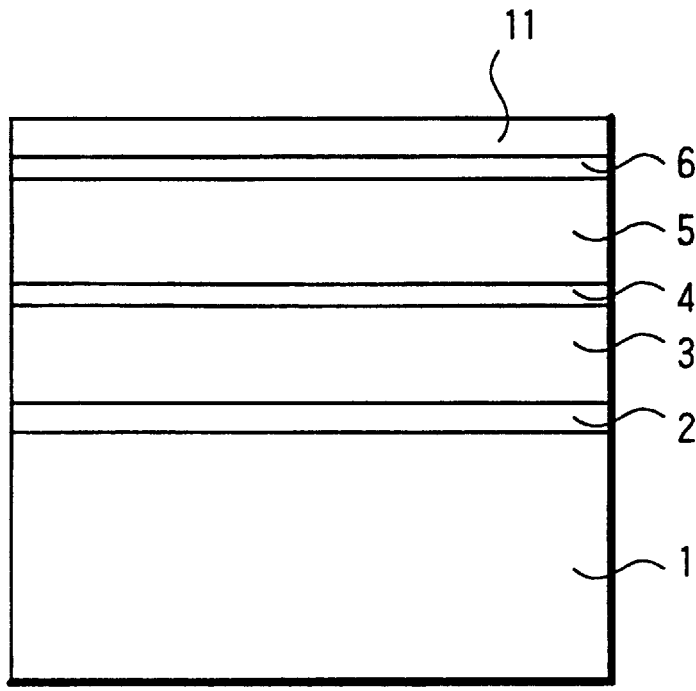
FIG. 11 is a schematic cross-sectional view illustrative of a step in a method of manufacturing a semiconductor light-emitting device according to another embodiment of the present invention.

As shown in FIG. 11, the buffer layer 2, the first cladding layer 3, the active layer 4, the second cladding layer 5 and the intermediate layer 6 are epitaxially deposited on the substrate 1 similarly to FIG. 5. Subsequently, in this epitaxial deposition process, a second conductivity-type, i.e., p-type GaAs capping layer 11 is epitaxially deposited on the intermediate layer 6, thereby forming a laminated semiconductor layer.

Figure 12:
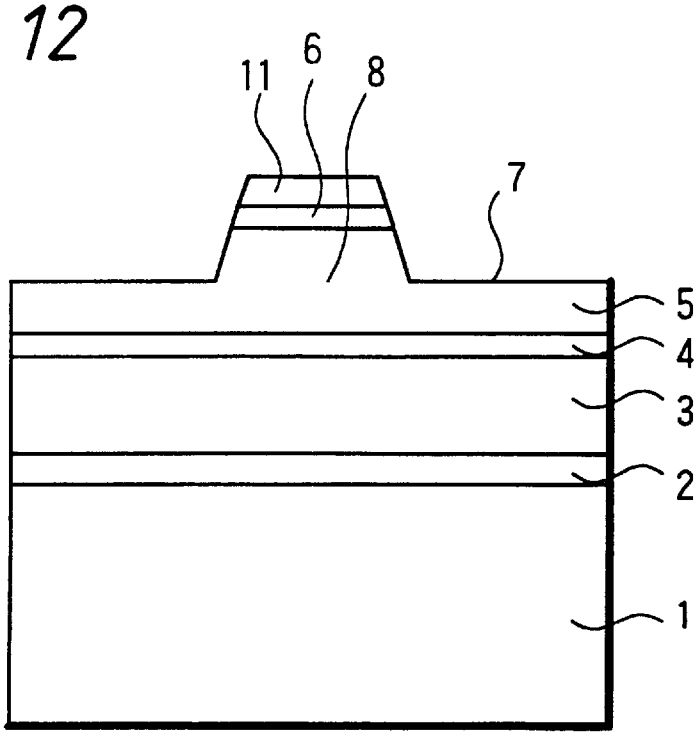
FIG. 12 is a schematic cross-sectional view illustrative of a step in a method of manufacturing a semiconductor light-emitting device according to another embodiment of the present invention.

Thereafter, as shown in FIG. 12, at least a pair of stripe-shaped grooves 7 are formed from the capping layer 11 to the second cladding layer 5 to a certain depth that they may not reach the active layer 4, for example, thereby forming the stripe-shaped ridge 8 between the two grooves 7.

Figure 13:
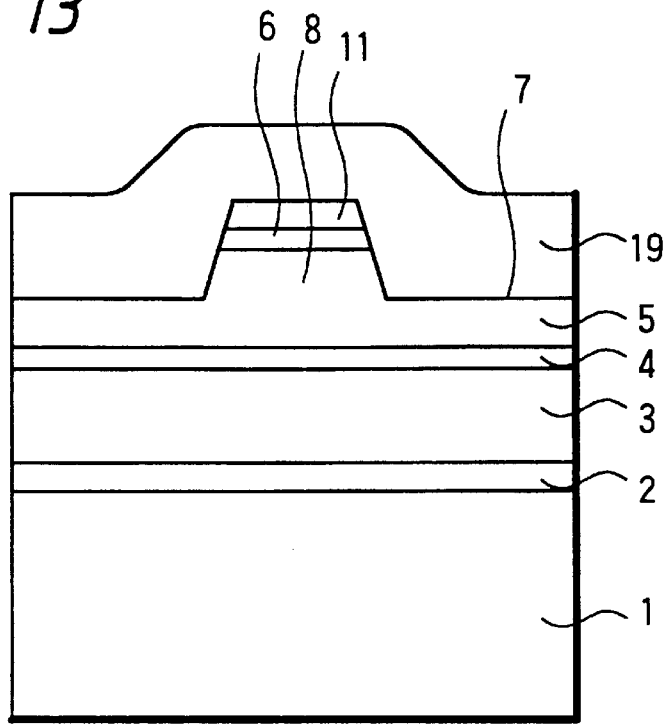
FIG. 13 is a schematic cross-sectional view illustrative of a step in a method of manufacturing a semiconductor light-emitting device according to another embodiment of the present invention.

As shown in FIG. 13, there is carried out the second epitaxial deposition process in which the AlGaAs first conductivity-type, i.e., n-type current confinement layer 19 is epitaxially deposited on the whole surface of the laminated semiconductor layer so as to bury the grooves 7 over the ridge 8.

Figure 14:
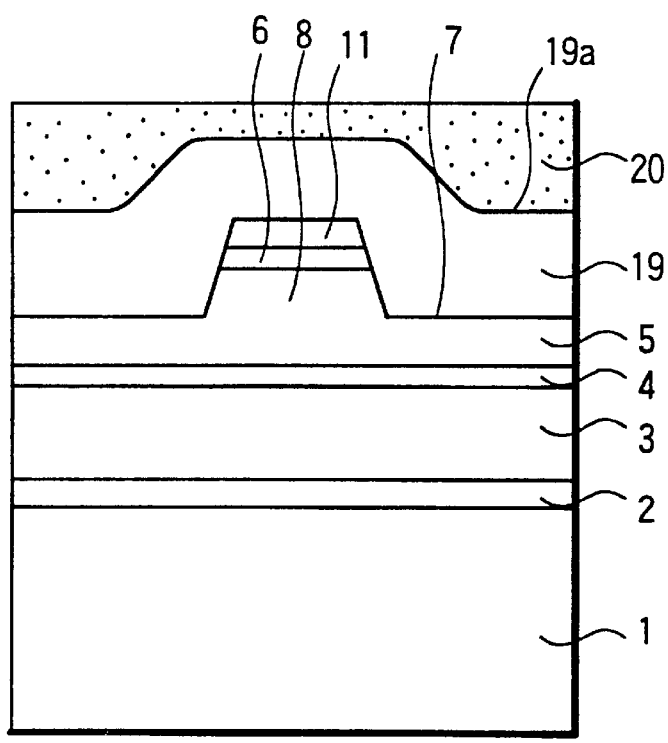
FIG. 14 is a schematic cross-sectional view illustrative of a step in a method of manufacturing a semiconductor light-emitting device according to another embodiment of the present invention.

Then, as shown in FIG. 14, there is carried out the planarization process in which the surface of the laminated semiconductor layer is made flat by coating the planarization layer 20 so as to bury a concave portion 19a produced on the surface of the current confinement layer 19 due to the existence of the grooves 7 on the deposited surface. This planarization process can be executed by spin-coating the photoresist, for example, on the current confinement layer 19 as the planarization layer 20.

Figure 15:
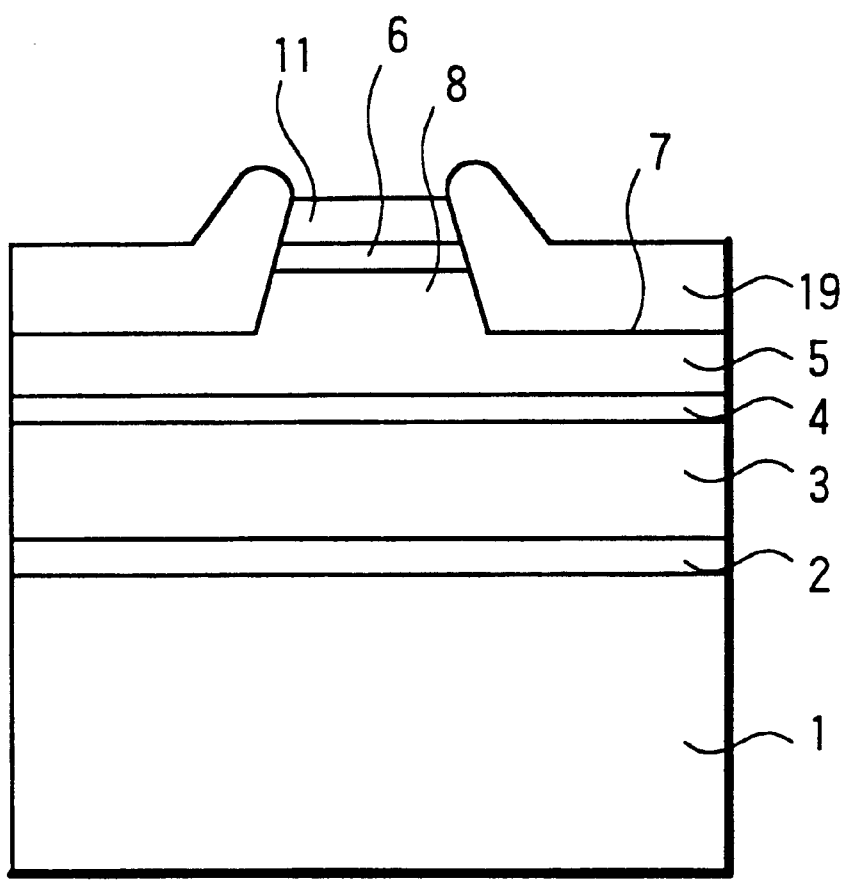
FIG. 15 is a schematic cross-sectional view illustrative of a step in a method of manufacturing a semiconductor light-emitting device according to another embodiment of the present invention.

Thereafter, the current confinement layer 19 on the ridge 8 is removed by treating the surface of the planarization layer 20 by etch back as shown in FIG. 15. That is, the current confinement layer 19 is limitedly formed within the grooves 7.

Although not shown, the first electrode is deposited on the capping layer 11 so as to form an ohmic-contact and the second electrode is deposited on the back of the substrate 1 so as to form an ohmic-contact.

As described above, also in the thus formed semiconductor laser, there is arranged the real-guide type semiconductor laser in which the first conductivity-type AlGaAs current confinement layers 19 with the band gap larger than that of the active layer 4 and whose refractive index is smaller than that of the active layer 4 are formed across the stripe-shaped ridge 8 so as to bury the grooves 7 formed at both sides of the stripe-shaped ridge 8.

According to this method, since the capping layer 11 is formed by the first epitaxial deposition process, the third epitaxial deposition process can be avoided unlike the first embodiment. Hence, the target semiconductor laser can be obtained by the second epitaxial deposition process.

Therefore, according to this method, although AlGaAS which cannot be epitaxially deposited generally is used to form the current confinement layers 19, the number of epitaxial deposition processes can be avoided from being increased.

The reason that the semiconductor laser according to the present invention includes the GaInP intermediate layer will be described below. That is, if the GaAs capping layer 11 is directly and epitaxially deposited on the AlGaInP cladding layer 5, then a gap in a valence band is produced between the GaAs capping layer 11 and the AlGaInP cladding layer 5, resulting in a large barrier being formed relative to implanted holes. Therefore, the GaInP intermediate layer 11 is formed in order to avoid such large barrier from being formed.

The semiconductor laser is able to control a wavelength of laser beam by selecting a band gap based on the selection of composition of the active layer. If the amount of Al in the current confinement layers 19 is selected in response thereto, then it is possible to form the current confinement layers with the band gap larger than that of the active layer and whose refractive index is smaller than that of the active layer. The following table 1 shows a relationship between a wavelength of laser beam and Al composition (x) of AlGaAs (n-type $Al_xGa_{1-x}As$) constructing the current confinement layers selected at that time. For example, when a wavelength of laser beam is 650 nm, Al composition (x) of $Al_xGa_{1-x}As$ to be selected is given as $x \geq 0.39$.

TABLE 1

| Wavelength of laser beam (nm) | Composition x of n-$Al_xGa_{1-x}As$ |
|---|---|
| 690 | $x \geq 0.30$ |
| 680 | $x \geq 0.32$ |
| 670 | $x \geq 0.34$ |
| 650 | $x \geq 0.39$ |
| 630 | $x \geq 0.45$ |

Figure 16:
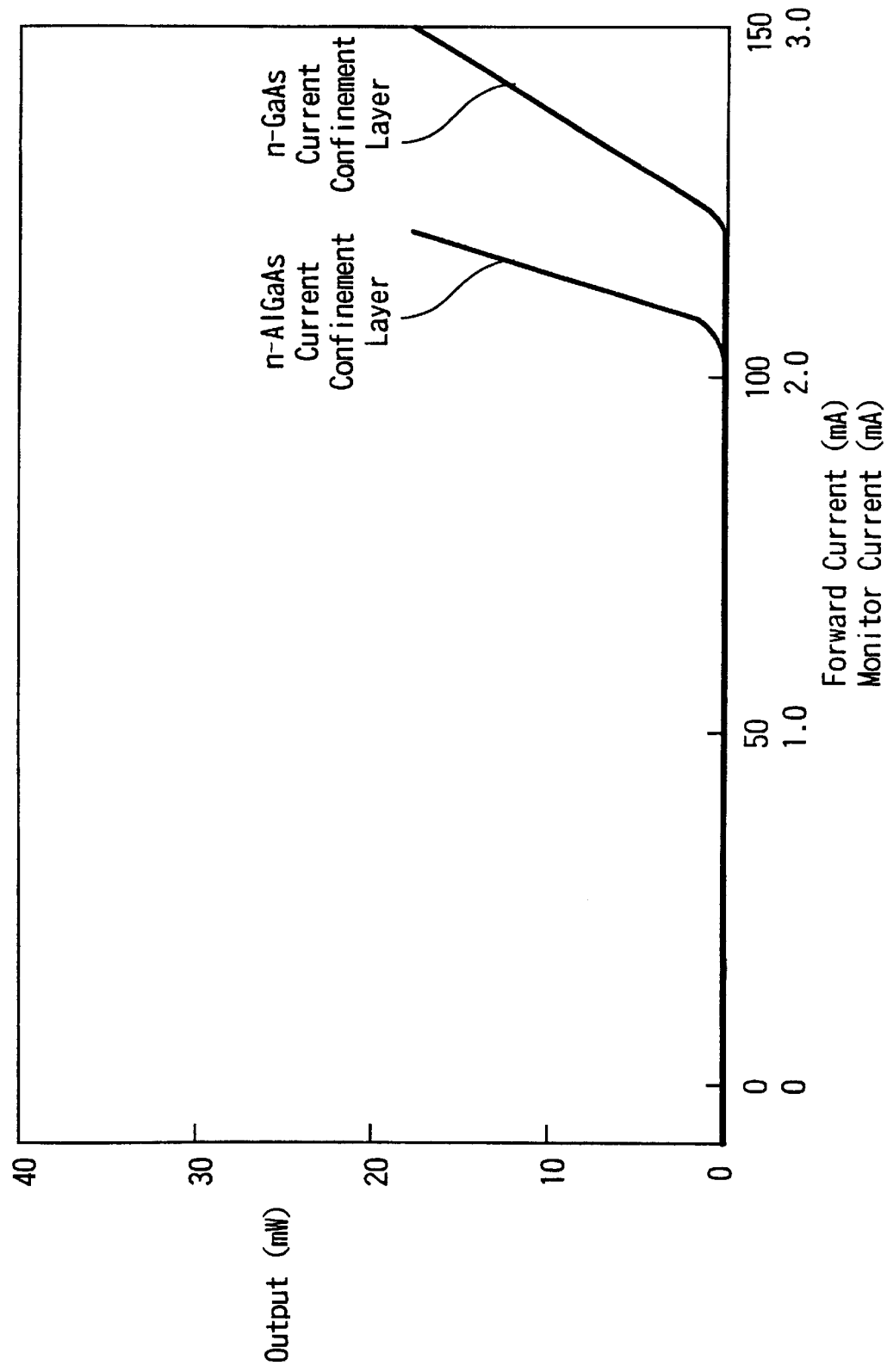
FIG. 16 is a characteristic graph showing measured results of light versus current characteristics obtained when the conventional semiconductor light-emitting device and the semiconductor light-emitting device according to the present invention are compared with each other.

FIG. 16 shows measured results of light versus current characteristics obtained when the semiconductor laser according to the present invention in which the current confinement layers are made of AlGaAs and the conventional semiconductor laser in which the current confinement layers are made of GaAs are compared with each other.

While the first conductivity-type is n-type and the second conductivity-type is p-type as described above, the present invention is not limited thereto and may be applied to the light-emitting device, e.g., the semiconductor laser in which the first conductivity-type is p-type and the second conductivity-type is n-type.

Further, while the first and second cladding layers are formed adjacent to the first and second active layer as described above, the principle of the present invention may be applied to a variety of semiconductor light-emitting devices such as semiconductor laser or light-emitting diode in addition to a semiconductor laser of so-called SCH (separate confinement heterostructure) structure in which a guide layer is disposed between the active layer 4 and the cladding layer.

As described above, according to the present invention, in the AlGaInP-based semiconductor light-emitting device, e.g., semiconductor laser, since the current confinement layer are made of AlGaAs, the current confinement layers with the band gap larger than that of the active layer and whose refractive index is smaller than that of the active layer can be formed by properly selecting the amount of Al, thereby resulting in the target real-guide type semiconductor laser being formed. Therefore, a power consumption of the semiconductor light-emitting device can be decreased, a current-to-light conversion efficiency thereof can be improved and the semiconductor light-emitting device can produce high output. Further, since the power consumption of the semiconductor light-emitting device according to the present invention can be decreased, a band gap difference of heterojunctions formed at both sides of the active layer can be suppressed to be small, whereby the band gap of the active layer can be increased. Thus, the semiconductor light-emitting device according to the present invention can emit laser beam of short wavelength.

Furthermore, according to the method of the present invention, the target real-guide type AlGaInP-based semiconductor light-emitting device, e.g., red semiconductor light-emitting device can be easily fabricated without complex processes.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing an AlGaInP-based semiconductor light-emitting device using only two epitaxial deposition processes, the method comprising the steps of:

a first epitaxial deposition process in which at least a first conductivity-type first cladding layer, an active layer, a second conductivity-type second cladding layer, a second conductivity-type intermediate layer and a second conductivity-type capping layer are sequentially epitaxially deposited on the semiconductor substrate;

an etching process for forming a stripe-shaped ridge on said laminated semiconductor layers to a depth such that said stripe-shaped ridge reaches said second cladding layer by etching;

a second epitaxial deposition process in which a first conductivity-type AlGaAs current confinement layer with a band gap larger than that of said active layer and whose refractive index is smaller than that of said active layer is epitaxially deposited over the top surfaces of both said capping layer and said second cladding layer so as to bury grooves formed at both sides of said stripe-shaped ridge, and wherein said intermediate layer and said capping layer are formed between edges of said current confinement layer;

a surface planarization process in which a planarization layer is formed over the current confinement layer; and a process in which said AlGaAs current confinement layer is partially removed by etch back wherein said AlGaAs current confinement layer is limitedly formed within said grooves and wherein a top surface of said capping layer is exposed.

2. A method of manufacturing a semiconductor light-emitting device as claimed in claim 1, in which said semiconductor light-emitting device is of a real-guide type.

3. A method of manufacturing a semiconductor light-emitting device as claimed in claim 1, in which said semiconductor substrate is made of GaAs.

4. A method of manufacturing a semiconductor light-emitting device as claimed in claim 1, in which said surface planarization process coats a photoresist on said current confinement layer.

* * * * *